United States Patent
List et al.

(10) Patent No.: US 6,377,901 B1
(45) Date of Patent: *Apr. 23, 2002

(54) METHOD AND APPARATUS FOR ADAPTIVELY LEARNING TEST MEASUREMENT DELAYS ON AN INDIVIDUAL DEVICE TEST FOR REDUCING TOTAL DEVICE TEST TIME

(75) Inventors: Steven K List; David T. Crook, both of Loveland, CO (US)

(73) Assignee: Agilent Technologies, Inc., Palo Alto, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/259,866

(22) Filed: Mar. 1, 1999

(51) Int. Cl.[7] ............................ G01R 31/14; G06F 19/00
(52) U.S. Cl. ............................ 702/119; 702/79; 702/117; 702/123
(58) Field of Search ........................ 702/57–59, 64–66, 702/69, 79, 108, 117–119, 120–123, 125, 177, 178, 183–185, 189; 324/500, 537; 714/724, 733, 734, 811, 815

(56) References Cited

U.S. PATENT DOCUMENTS

| | | | | |
|---|---|---|---|---|
| 3,931,506 A | * | 1/1976 | Borrelli et al. ............ | 714/724 |
| 4,724,378 A | * | 2/1988 | Murray et al. ............ | 714/738 |
| 4,792,932 A | * | 12/1988 | Bowhers et al. ............ | 368/113 |
| 5,305,238 A | * | 4/1994 | Motohara et al. ........... | 714/741 |
| 5,444,390 A | * | 8/1995 | Bartlett et al. ............. | 324/770 |
| 6,002,868 A | * | 12/1999 | Jenkins et al. ................ | 717/1 |
| 6,064,948 A | * | 5/2000 | West et al. ................ | 702/119 |
| 6,070,260 A | * | 5/2000 | Buch et al. ................ | 714/731 |
| 6,263,463 B1 | * | 7/2001 | Hashimoto .................. | 714/724 |

OTHER PUBLICATIONS

Adaptive Test Timing Characterization, Dec. 1984, IBM Technical Disclosure Bulletin, vol. 27, Issue 7A, pp. 3835–3838.*

* cited by examiner

*Primary Examiner*—Marc S. Hoff
*Assistant Examiner*—Manuel L. Barbee (57) ABSTRACT

An adaptive delay learning algorithm is presented that reduces the amount of delay before making test measurements in an automated test that requires a delay of any type to be completed before a measurement is made in order to remove the possibility that a tester component lying in the measurement path has not achieved a ready state. In the execution of an automated test, a current delay time is set to an initial delay value. Test execution does not begin until the current delay time elapses. If, upon execution, the test fails, the current delay time is set to a different delay time, and the test is reexecuted only after the updated current delay time has elapsed.

18 Claims, 6 Drawing Sheets

METHOD AND APPARATUS FOR ADAPTIVELY LEARNING TEST MEASUREMENT DELAYS ON AN INDIVIDUAL DEVICE TEST FOR REDUCING TOTAL DEVICE TEST TIME

FIELD OF THE INVENTION

The present invention pertains generally to automated testing techniques, and, more particularly, to a method for adaptively learning test measurement delays on an individual device test for the purpose of reducing the total device test time.

BACKGROUND OF THE INVENTION

Automated equipment is used to perform a wide variety of tasks that might otherwise be performed manually at a slower rate and/or greater cost. Automation of a task typically incurs the overhead of a systematic delay before each performance of the actual task due to systematic delays in the automated equipment as it seeks a ready state. For example, in the large-scale production of electronic circuits, automated test equipment is used for setting up and performing tests on each circuit board of a run of circuit boards. A run is a testing sequence of the same type of assembly with no intervening different types of assemblies. A typical automated circuit tester includes a measurement circuit, a bed-of-nails fixture, and a set of programmable relay matrices and internal measurement busses. When testing a circuit under test, the circuit under test is seated on the fixture, which probes nodes of the component under test. Before measurements may be safely obtained without risk of any errors in the measurements due to the tester itself, the automated circuit tester must achieve a ready state in which all desired measurement paths and associated components are fully operational and in the correct position or configuration. Typically, automated testers include multiple components that must be configured and/or waited upon before the tester can be guaranteed to be in a ready state to perform the actual task at hand. Often there exists no method of determining whether a given tester component is in a ready state. For example, in a tester that comprises a programmable relay matrix, there is an inherent delay caused by the programming of the matrix followed by a delay caused by the actuation of each of the relays. Because no method exists for visually or otherwise determining whether a relay has opened or closed, a typical tester will wait the maximum rated delay time for the relay as specified by the relay manufacturer. If the relay open/close actuation wait times are anything less than the specified maximum relay open/close actuation times, incorrect measurements could occur due to incomplete connections (i.e., relays not yet being closed when the measurements are made). Because the actual actuation time of the slowest operating relay component in the tester may in fact be far less than the maximum specified actuation time, the test time overhead due to the systematic delay of the tester is greater than it need be, thereby yielding less production efficiency than achievable. In the testing of a long run of boards, the systematic delay overhead can add up to a significant amount of lost time. In addition, even though the test system is being set up in parallel with the relay open/close times, as coding techniques, software compilers, and native controllers improve in speed, the dominant time spent in making a simple component under test measurement will be waiting for the interconnect relays to physically open/close. As a result, the measurement test time is governed by the physical connection of the circuit under test to the measurement instruments.

Accordingly, a need exists for a system and method for adaptively learning the systematic delays of an automated tester in order to reduce the total testing time.

SUMMARY OF THE INVENTION

The present invention improves over prior art circuit automated testing techniques in several ways. The invention can be used to adapt to systematic delays in setting up the test configuration circuit, including delays in tester components lying in the measurement paths such as relay actuation times, achieving a steady state after turning on a DC power source, and any other type of delay that occurs between the initiation of the test configuration circuit setup until the test configuration circuit is in a ready state to allow measurements of a component under test to be taken.

In accordance with the method of the invention, the measurement delay times associated with executing a test on an automated tester are adaptively learned by setting a current delay time to an initial delay value, waiting the current delay time, and executing the test in which measurements are obtained by the automated tester. A determination is made based on the measurements as to whether the test passed or failed. If the test fails, because it may be due to a "false failure" condition due to the current delay time not having been long enough for the automated tester to have achieved a ready state, the current delay time is then reset to a different delay time, and the test is reexecuted after waiting the different delay time. In the preferred embodiment, the different delay time is set to the maximum specified delay time as specified by the component manufacturer for the slowest component that lies in the measurement paths in order to ensure that if the test fails after a retry, that the failure is not due to incomplete measurement path connections or the tester not having yet achieved a ready state when the measurements are taken.

BRIEF DESCRIPTION OF THE DRAWING

The invention will be better understood from a reading of the following detailed description taken in conjunction with the drawing in which like reference designators are used to designate like elements, and in which.

DETAILED DESCRIPTION

The present invention describes an adaptive learning algorithm that reduces the amount of delay before making test measurements in an automated test that requires a delay of any type (e.g., a device connection delay, a settling time delay, a measurement delay, etc.) to be completed before a measurement is made in order to remove the possibility that a tester component lying in the measurement path has not achieved a ready state. Although the illustrative embodiment described herein is in the context of an analog in-circuit test where the connecting devices are relays, it will be appreciated by those skilled in the art that the invention may be equally applied to any automated measurement test (e.g., in-circuit test, functional test, etc.) which relies on the completion of a delay (e.g., device connection delay, settling time delay, measurement delay, etc.) to ensure that a tester component (e.g., a reed relay, a mercury wetted relay, a solid-state switch, a mechanical switch, any device that requires a wait for a mechanical action to be performed, etc.) that lies in, or is required to configure, the measurement path and is used in the retrieval of a measurement is in a ready state.

An example of an automated test is the performance of an in-circuit test. In-circuit testing, which verifies the proper electrical connections of the components on the printed circuit (PC) board, is typically performed using a bed-of-nails fixture or robotic flying-prober. A robotic flying-prober is set of probes that may be programmed to move which replaces the bed-of-nails for measuring a particular component under test. The bed-of-nails fixture/robotic flying-prober probes the nodes on the circuit under test printed on a printed circuit (PC) board that are associated with a particular component of the circuit that is currently under test, applies a set of stimuli, and takes measurements of the responses. The measurement responses are used to calculate a value for the component under test. The calculated value is compared to predetermined specified test limits to determine whether the test passed or failed.

Figure 1:
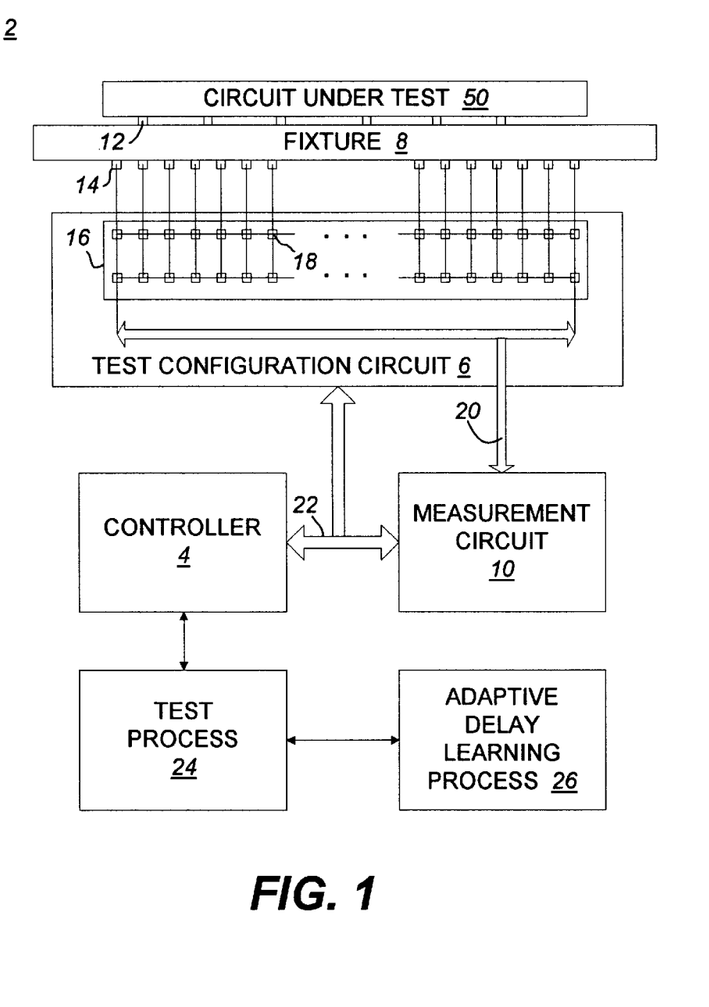
FIG. 1 is a block diagram of an automated in-circuit test setup.

FIG. 1 is a schematic block diagram of an automated test system 2. As illustrated, test system 2 includes a controller 4, test configuration circuit 6, fixture 8, and measurement circuit 10. A PC board containing the circuit under test 50 is shown mounted on fixture 8. Fixture 8, known in the art as a bed-of-nails fixture, is customized for each PC board layout and includes a plurality of probes 12 that electrically connect to nodes of the circuit under test 50 when the circuit under test 50 is properly seated on the fixture 8. Probes 12 are coupled, via wires (not shown) within the fixture 8, to interface pins 14. Test configuration circuit 6 includes a matrix 16 of relays 18 which is programmable via controller 4 over control bus 22 to open and/or close each relay 18 in the matrix 16 to achieve any desired connection between the interface pins 14 and a set of internal measurement busses 20. Internal measurement busses 20 are electrically connected to nodes of measurement circuit 10. The particular nodes of measurement circuit 10 which are connected to the set of measurement buses 20 may be hardwired within the measurement circuit 10, or alternatively, may be configurable via another programmable matrix (not shown) of relays. Controller 4 receives test setup instructions from test process 24 to program the matrix 16 (and other relay matrices, if they exist) to achieve a set of desired connection paths between the circuit under test 50 and: measurement circuit 10. Adaptive delay learning process 26, discussed in detail hereinafter, attempts to reduce the amount of delay between initiation of the test configuration setup and when the test configuration circuit is in a ready state.

Figure 2A:
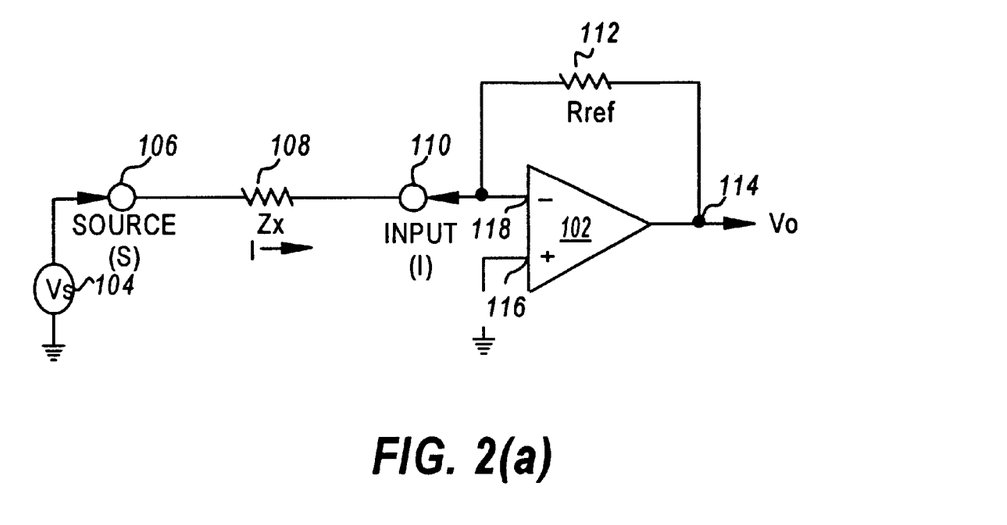
FIG. 2(a) is a prior art two-wire test configuration circuit.

FIG. 2(a) is one instance 100 of a prior art measurement circuit 10. Measurement circuit 100 is known as a "two-wire" measurement circuit. Measurement circuit 100 includes operational amplifier (op-amp) 102 having a positive terminal 116 coupled to ground and a negative input terminal 118 coupled to an input node I 110. A reference resistor $R_{ref}$ 112 is coupled between output node $V_o$ 114 and input node I 110 of op-amp 102. A component under test 108 having an unknown impedance $Z_x$ is coupled between input node I 110 and a source input node S 106 upon which a known reference voltage $V_s$ is delivered by a voltage stimulus source 104. Assuming an ideal op-amp circuit, measurement circuit 100 assumes that the current through the unknown impedance $Z_x$ of the component under test 108 is equal to the current through reference resistor $R_{ref}$ 112 and that op-amp 102 maintains a virtual ground at negative input terminal 118. Thus, in an ideal op-amp circuit, theoretical impedance calculation is:

$$Z_x = -R_{ref}(V_s/V_o) \quad \text{(Equation 1).}$$

The use of a precision DC voltage stimulus source 104 and a DC detector at output node $V_o$ 114 is employed to determine the resistive component of the output voltage when testing resistive analog components such as resistors. The use of a precision AC voltage stimulus source 104 and a phase synchronous detector at output node $V_o$ 114 is employed to determine the reactive components of the output voltage when testing reactive analog components such as capacitors and inductors.

Device measurements are often complicated by error sources introduced by printed circuit (PC) board topology configurations which introduce impedances in parallel with the component under test 108. Additionally, bed-of-nails fixture wiring and probes that are used to probe the nodes on the circuit under test 50 for in-circuit measurements, system relays, and system busses that connect the component under test 108 into the measurement circuit 100 can also cause measurement problems. The bus wires represent impedances in series with the component under test 108. These are classes of lead impedance errors. Thermal electromagnetic forces (EMFs) of the system relays can appear as temperature-dependent voltage sources. The bi-metallic contacts of a relay forms a basic thermocouple device. When these contacts are heated, either by current flow or via other heat sources with the system, a temperature dependent output voltage (i.e., a thermal offset) is generated. These are classes of voltage offset errors. The error sources described above can be categorized into three main types of error sources: (1) source voltage errors; (2) guarding errors; and (3) current measurement errors. Compensation techniques such as guarding and multi-wire measurements, which consist of active or passive sensing and or enhancement measurements, are used to compensate for the effects of these three types of error sources.

Measurements are typically taken at the output node $V_0$ 114 of the measurement circuit 100. Additional measurements are often taken to reduce guard errors and compensate for lead impedances. For example, in a 6-wire measurement test configuration circuit shown in FIG. 2(b), connections are made to connect the source node S 106, input node I 110, source sense node A 107, input sense node B 111, lead sense node L 128 to the circuit under test 50 so that measurements can be made on those buses in order to compensate for the above-mentioned error sources.

Figure 2B:
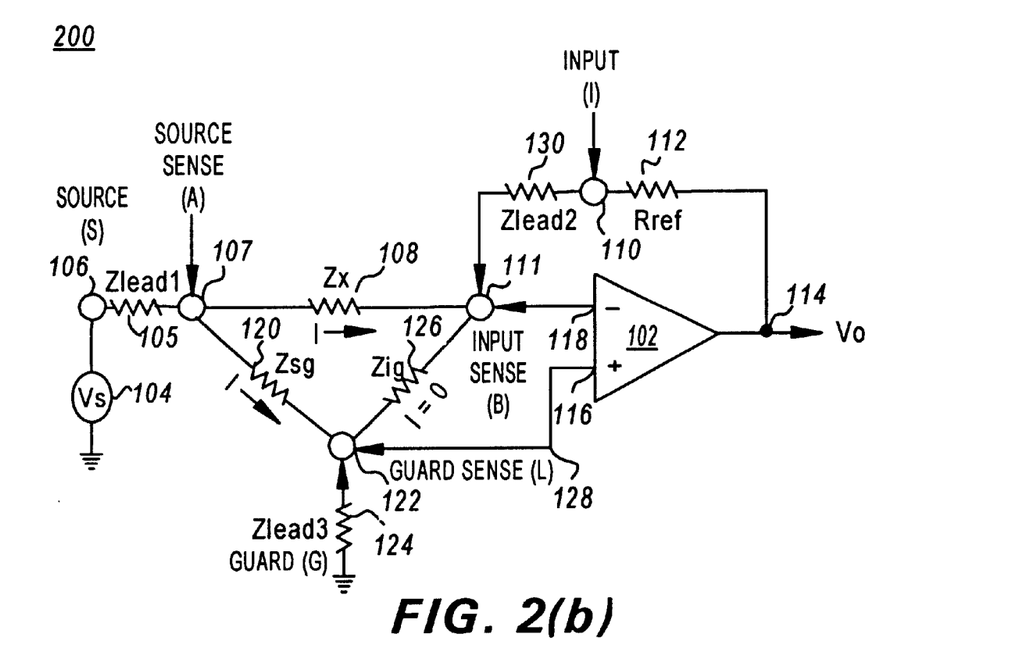
FIG. 2(b) is a prior art six-wire test configuration circuit.

In order to take a set of measurements, the paths from the component under test 108 to the measurement circuit 10 is set up by programming the relay matrix 16 to configure the relays 18 to electrically connect the bed-of-nails fixture 8 probes 12 that are electrically connected to the nodes on the circuit under test 50 to the measurement circuit 10 via the internal measurement busses 20. In the example of FIG. 2(a), the internal measurement busses include an S bus and an I bus which are respectively electrically connected to the S node 106 and I node 110. In the example of FIG. 2(b), the internal measurement busses include the S bus and I bus, and additional busses A bus, B bus, L bus, and G bus. Connections of the internal measurement busses 20 from the circuit under test 50 to the measurement circuit 10 is performed at the beginning of the test for the component under test 108, during the test setup. After the connections have been made, the actual test measurements of the component under test 108 may be obtained by the measurement circuit 10 after waiting for the inherent delays of the connections to be completed. At the conclusion of the test, the relay connections are all initialized to a known state in preparation for the start of the next test.

Figure 3:
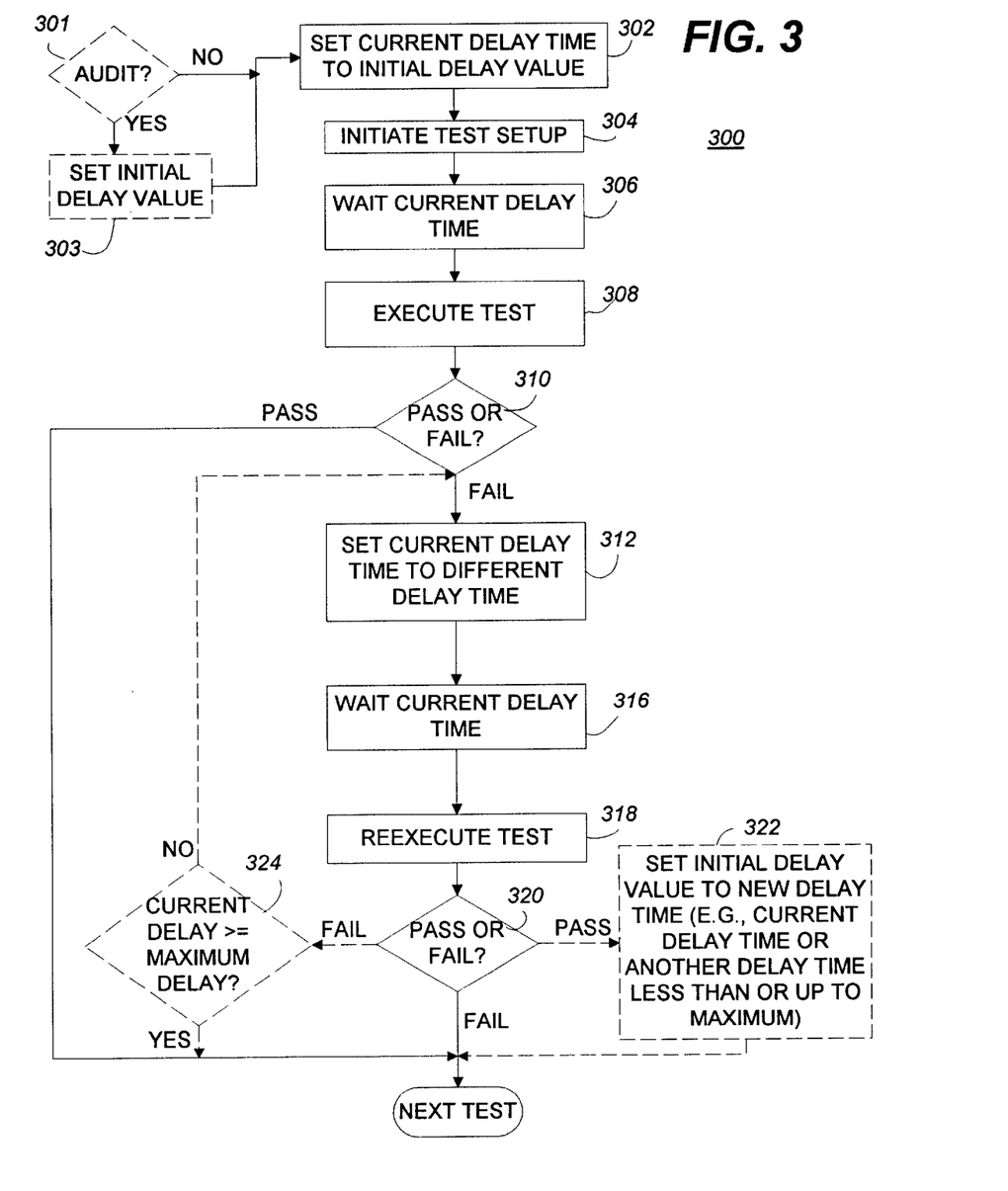
FIG. 3 is a flowchart of a method in accordance with the invention.

FIG. 3 is an operational flowchart of the adaptive delay learning process 26 of the invention. As shown, a current delay value is set 302 to an initial delay value. The initial delay value may be a value set by a test engineer based on experience or empirical test data, or may be arrived at via a search and/or optimization algorithm, discussed in more detail hereinafter. After the current delay time is set to the initial delay time, test setup is initiated 304. In the illustrative embodiment, this step includes the programming of the test configuration circuit 6 in order to program the relay matrix 16 to open and/or close the relays 18 to set up the measurement paths from the circuit under test 50 to the measurement circuit 10. Execution of the test is then delayed 306 by the current delay time. The test is then executed 308, wherein measurements of the circuit under test 50 are taken. A determination is made 310, based on the measurements, as to whether the test passed or failed. If the test passed, the test is complete, and a new circuit under test 50 may be tested. If the test failed, the current delay time is set 312 to a different delay time, preferably an increment longer than the previous current delay time. In the illustrative embodiment, the different delay time is the maximum manufacturer specified delay time of the slowest component that lies in any measurement path in the system. The execution of the test is delayed 316 by the updated current delay time. Once the current delay time has elapsed, the test is reexecuted 318, and a determination is made 320 as to whether the test passed or failed. The test can end at this point, using the results of the reexecuted test as the final test results. This would be especially appropriate if the updated current delay time had been updated to the maximum manufacturer specified delay time of the slowest component that lies in any measurement path in the system since that would ensure that a failing test result could not be due to any systematic delay of the automated tester.

If the test passed after reexecution 318 of the test, this may indicate that the initial delay value is too short for the current test configuration. Accordingly, an optional step is to update the initial delay value by setting 322 the initial delay value to a new delay value. The new delay value may be the current delay time that resulted in the passing status of the test, or may be a delay time less than or up to the predetermined maximum delay time.

If the test failed after reexecution 318 of the test, the retry on failure branch of the test (including setting the current delay time to a different delay time, waiting the current delay time, and reexecuting the test after the current delay time has elapsed) can be optionally repeated until either said test passes or it is determined 324 that the different delay time is equal to or greater than the pre-determined maximum delay time. This step, combined with the initial delay value updating step 322, operates to quickly optimize the initial delay value if each succeeding different delay times in step 312 is chosen to be a small increment of the preceding different delay time.

Another step that may be performed is a periodic 301 audit function 303 in which the initial delay value is reset. Again, the initial delay value may be reset to a value set by a test engineer based on experience or empirical test data, or may be arrived at via a search and/or optimization algorithm, discussed in more detail hereinafter.

Figure 4:
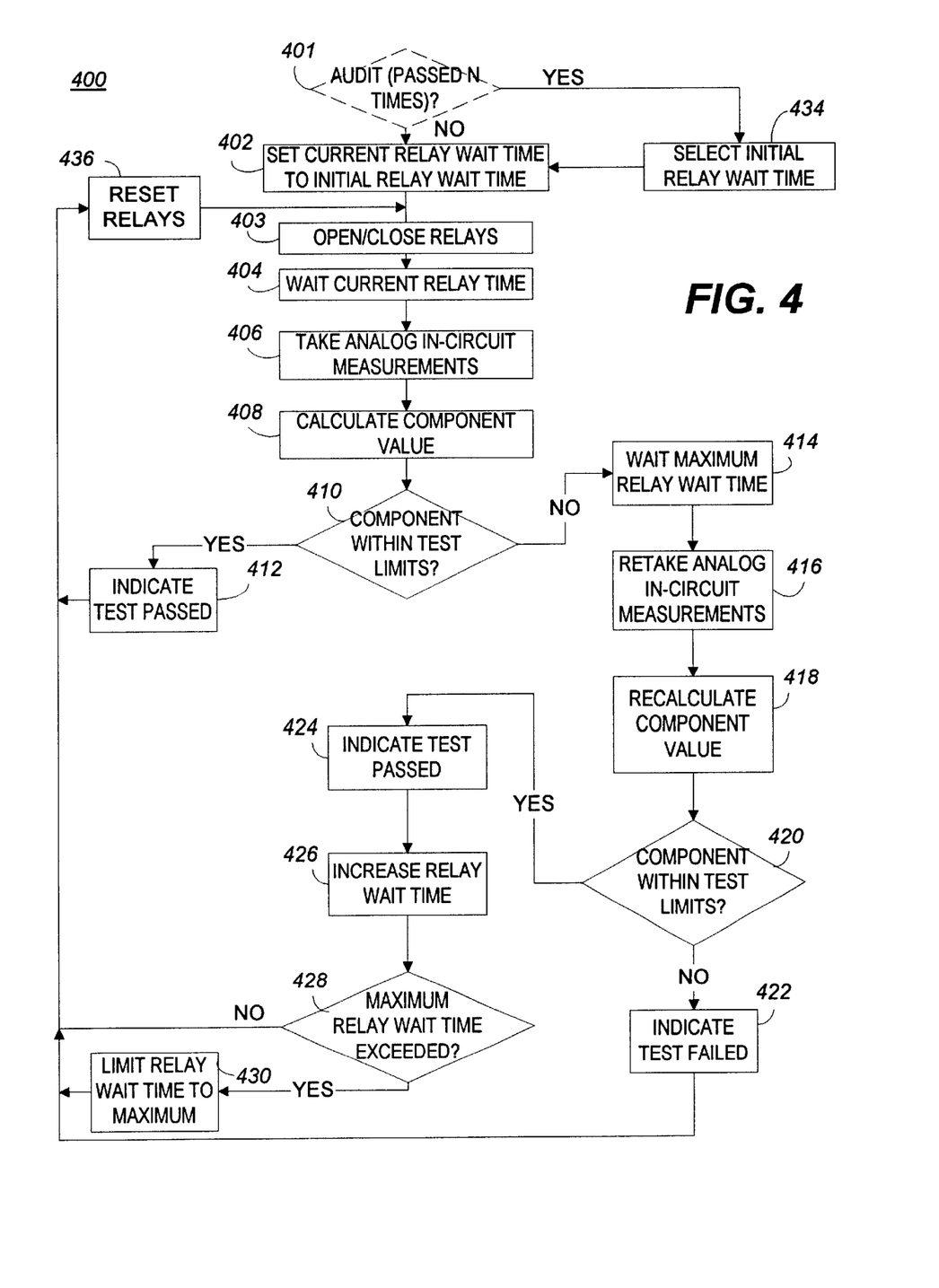
FIG. 4 is a flowchart of one embodiment of an adaptive delay learning algorithm in accordance with the invention.

FIG. 4 is a flowchart of one embodiment 400 of an adaptive measurement delay learning algorithm used by test system 2 of FIG. 1 in determining the amount of delay to use to ensure that the test configuration circuit 6 has achieved a ready state. As shown, a current relay wait time is set 402 to an initial relay wait time at the beginning of a run of boards to be tested, preferably using a value less than the manufacturer specified maximum delay time of the relays. Test setup is initiated by opening and/or closing 403 appropriate relays in the relay matrix to complete the measurement paths. In-circuit measurements of a component under test on the circuit under test 50 are obtained 406 after waiting the current relay wait time 404. A component under test value is calculated 408 using the measurements just obtained and compared 410 with predetermined test limits. If the calculated value for the component under test is within the predetermined test limits, the passing result is indicated 412 and a new test may be performed after resetting 436 the relays.

If the calculated value for the component under test is not within the predetermined test limits, the maximum relay wait time as specified by the measurement component manufacturer is forced to elapse 414, and then the in-circuit measurements are reobtained 416. The value of the component under test is then recalculated 418 using the measurements just obtained and compared to the predetermined test limits 420 to determine whether the initial failure of the component under test was a valid failure. If the calculated value of the component under test using the remeasured measurements is still not within the predetermined test limits, then the failure condition as detected on the first measurement readings was valid, and the test process 24 indicates 422 that the component under test failed the test and a new test may be performed after resetting 436 the relays.

If, however, the component under test is within the predetermined test limits on the second measurements reading, a "false failure" condition has occurred. In this case, the test process 24 indicates 424 that the component under test passed the test, and the relay wait time is increased 426 by a predetermined value. The predetermined value may be a standard increment set by the test design engineer, or may be determined according to an algorithm such as a linear unidirectional search, linear bidirectional search, or bidirectional search with varying step size described hereinafter. The increased relay wait time is compared 428 to the maximum relay wait time, and limited 430 to the maximum relay wait time if it exceeds the maximum relay wait time. The relays are reset 436 for the next test. The increased relay wait time is then used as the relay wait time for subsequent tests.

An optional audit function may be implemented in the adaptive measurement delay learning algorithm 400 in which the relay wait time is reset 434 if a predetermined period (e.g., a predetermined number N of consecutive tests in the current run of boards) passed 401.

Figure 5:
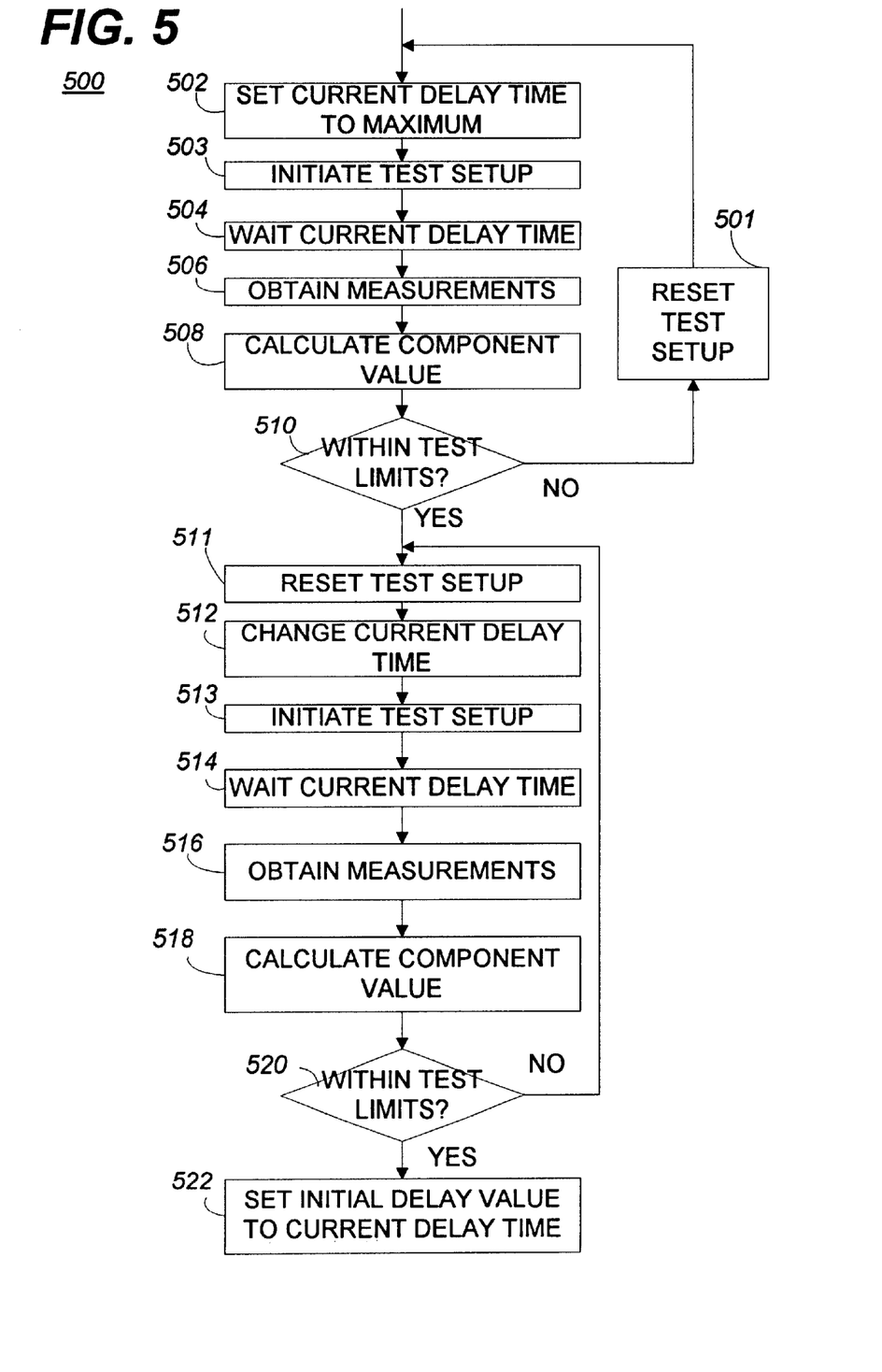
FIG. 5 is a flowchart of one embodiment of a delay time determination method.

As described previously, many methods that are known in the art may be used to determine the initial delay time. FIG. 5 is a flowchart of one embodiment 500 of a wait time determination method in accordance with the invention. The current delay time is initially set 502 to the maximum relay wait time as specified by the manufacturer. Test setup is then initiated 503. Measurements are taken 506 after waiting 504 the current delay time, and the component under test value is calculated 508 and compared 510 to the predetermined test limits. If the calculated value of the component under test is not within the predetermined test limits, the test setup is reset 501, and steps 502 through 510 are repeated using a new board since, because the maximum relay wait time was used, it is known that the failure of the test is not due to systematic delays in the test configuration circuit 6.

If the value of the component under test is within the predetermined test limits, then the test setup is reset 511 and the current delay time is changed 512. The amount of delay by which the current delay time is changed depends on the implementation. Various algorithms may be used including decreasing by a fixed step as determined by the design engineer, or alternatively determined according to an algorithm such as a linear search algorithm in which the step size by which the current delay time is decreased is a fixed a value, or a bidirectional search with varying step sizes in which the step size is decreased by a fixed value, and if it fails the step size is increased by a fraction of the previous fixed value, and if it passes then decreased by a fraction of the previous fixed value, and if it fails then increased by a fraction of the previous fixed value, etc. (e.g., successive approximation). Once the delay time is changed in step 512, test setup is initiated 513 and the measurements are reobtained 516 from the circuit under test 50 after waiting 514 the changed current delay time. The value of the component under test is then recalculated 518 using the measurements just obtained and compared 520 to the predetermined specified test limits. If the value is not within the predetermined test limits, the current delay time is changed again and steps 511 through 520 are repeated. If, however, the value of the component under test is within the predetermined test limits, then the current delay time may be used in place of the maximum delay time and the initial delay value is set 522 to the current delay time.

Figure 6:
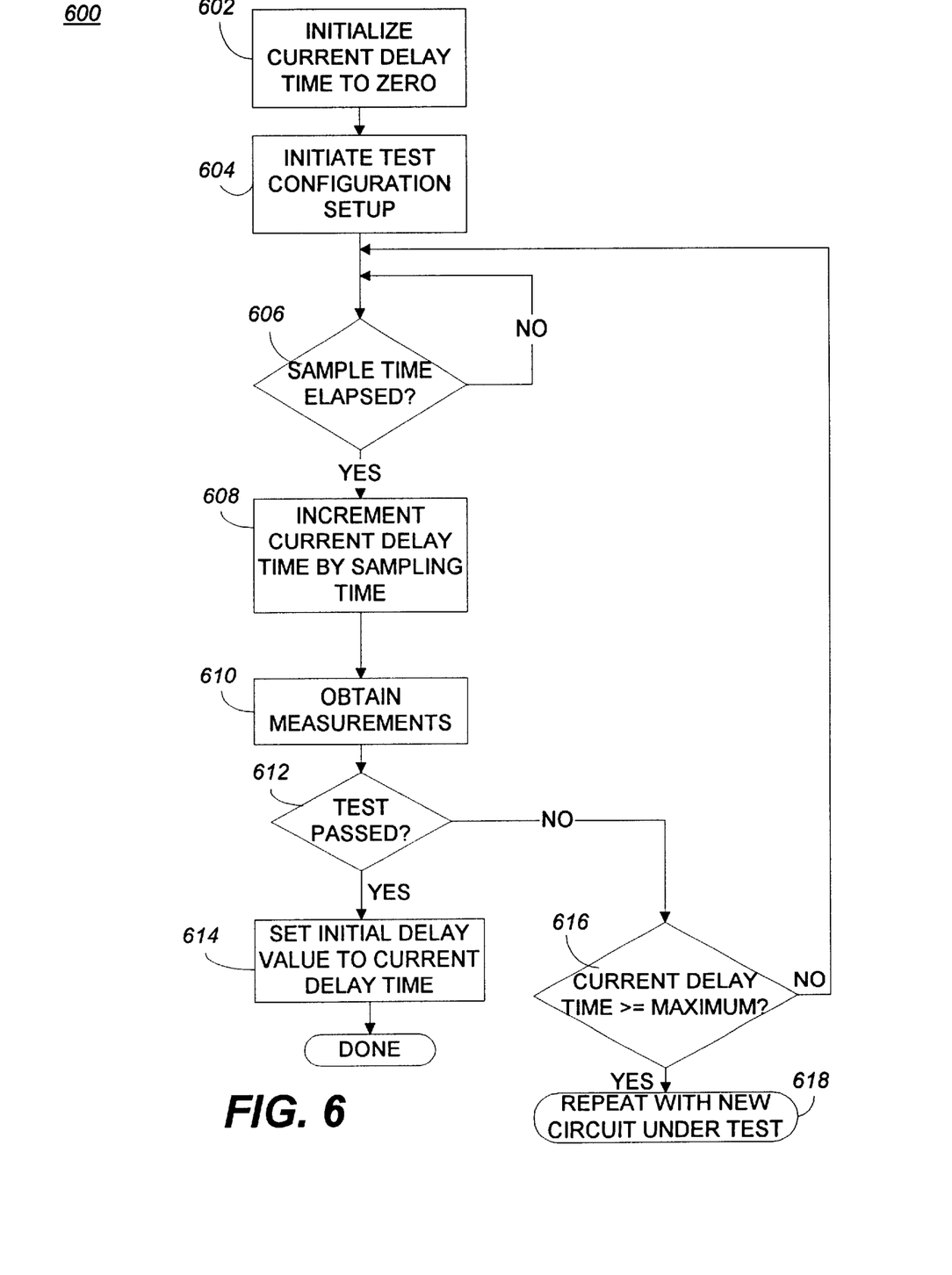
FIG. 6 is a flowchart of an alternative method for determining the initial delay time.

Another method for determining the initial delay value is illustrated in FIG. 6. This method 600 is based on a sampling algorithm. According to this method, a current delay time is initialized 602 to zero. The test configuration circuit setup is then initiated 604. After a predetermined fixed sample time has elapsed 606, the current delay time is incremented 608 by the fixed sample time and measurement readings are obtained 610 from the circuit under test 50. A determination is made 612 as to whether the test passed based on the measurement readings. If the test passed, the initial delay value is set 614 to the current delay time. If the test failed, steps 606 through 612 are repeated until either the test passes or the current delay time is greater than or equal to the predetermined maximum delay time. If the current delay time becomes greater than or equal to the predetermined maximum delay time, the circuit under test contains a real failure, so the process is repeated using a new circuit under test.

It will be appreciated from the above description that the present invention improves over prior art testing techniques by reducing the systematic delay time for each iteration of an automated test. Over a long run of devices to be tested, the overall savings in test time can be quite significant.

Although the invention has been described in terms of the illustrative embodiments, it will be appreciated by those skilled in the art that various changes and modifications may be made to the illustrative embodiments without departing from the spirit or scope of the invention. It is intended that the scope of the invention not be limited in any way to the illustrative embodiment shown and described but that the invention be limited only by the claims appended hereto.

What is claimed is:

1. A method for adaptively learning systematic delay times of a test configuration circuit, said test configuration circuit operable to execute a test which obtains one or more measurements from a device under test via one or more measurement paths, comprising:
    setting a current test configuration setup delay time to an initial delay value;
    initiating configuration of said test configuration circuit;
    waiting said current test configuration setup delay time;
    executing said test; and
    if said test fails:
        resetting said current test configuration setup delay time to a different delay time;
        waiting said current test configuration setup delay time; and
        reexecuting said test.

2. A method in accordance with claim 1, wherein:
    said different delay time comprises a pre-determined maximum delay time.

3. A method in accordance with claim 1, wherein:
    if said reexecuted test passes:
        setting said initial delay value to a new delay value.

4. A method in accordance with claim 3, wherein:
    said new delay value comprises said current test configuration setup delay time.

5. A method in accordance with claim 3, wherein:
    said new delay value comprises a value less than said pre-determined maximum delay time.

6. A method in accordance with claim 1, wherein:
    if said reexecuting step results in a fail status:
        repeating said resetting step through said reexecuting step until either said test passes or said different delay time comprises a pre-determined maximum delay time.

7. A method in accordance with claim 1, comprising:
    periodically performing an audit function in which periodically said initial delay value is selected.

8. A method in accordance with claim 7, wherein:
    said initial delay value is selected by:
    setting said initial delay value to a maximum relay wait time;
    initiating configuration of said test configuration circuit;
    waiting an amount of time indicated by said initial delay value;
    executing said test;
    if said test passes:
        resetting said test configuration circuit;
        setting said initial delay time to a different delay time, said different delay time being less than said initial delay time;
        initiating configuration of said test configuration circuit;
        waiting said reset initial delay time;
        reexecuting said test; and
        repeating said resetting step through said repeating step if said test passes.

9. A method in accordance with claim 7, wherein:
    said initial delay value is selected by:
    initializing said initial delay value to an initial time;
    initiating configuration of said test configuration circuit;
    waiting a sample time;
    incrementing said initial delay value by said sample time;

executing said test;

determining whether said test passed or failed; and repeating said waiting a sample time step through said repeating step if said test failed.

10. A method in accordance with claim 1, comprising:

selecting said initial delay value.

11. A method in accordance with claim 10, wherein:

said selecting step comprises:

setting said initial delay value to a maximum relay wait time;

initiating configuration of said test configuration circuit;

waiting an amount of time indicated by said initial delay value;

executing said test;

if said test passes:

resetting said test setup;

setting said initial delay time to a different delay time, said different delay time being less than said initial delay time;

initiating configuration of said test configuration circuit;

waiting said reset initial delay time;

reexecuting said test; and repeating said resetting step through said repeating step if said test passes.

12. A method in accordance with claim 10, wherein:

said selecting step comprises:

initializing said initial delay value to an initial time;

initiating configuration of said test configuration circuit;

waiting a sample time;

incrementing said initial delay value by said sample time;

executing said test;

determining whether said test passed or failed; and repeating said waiting a sample time step through said repeating step if said test failed.

13. An automated method for adaptively learning relay wait times of relays in an automated test system performing a test of a component under test, comprising:

configuring said relays;

waiting a current relay wait time;

obtaining measurements of said component under test;

determining whether said test passed or failed based on said obtained measurements;

if said test failed:

waiting a retry relay wait time;

reobtaining said measurements of said component under test; and redetermining whether said test passed or failed based on said reobtained measurements.

14. A method in accordance with claim 13, wherein:

said retry relay wait time comprises a wait time greater than said current relay wait time.

15. A method in accordance with claim 14, wherein:

if said retry relay wait time comprises a wait time greater than a predetermined maximum relay wait time, said retry relay wait time is set to said predetermined maximum relay wait time.

16. An automated testing system for testing a component under test, comprising:

a test configuration circuit that connects to said component under test;

a test measurement circuit connected to said test configuration circuit which is responsive to a measurement request to obtain measurements from said component under test;

a test process which waits a initial delay time, requests said measurements from said test measurement circuit, receives said obtained measurements, determines whether said component under test passes or fails based on said obtained measurements, and if said test fails: waits a retry delay time, re-requests said measurements from said test measurement circuit, re-receives said obtained measurements, and re-determines whether said component under test passes or fails based on said re-obtained measurements; and an adaptive delay learning process which sets said current delay time to an initial delay value, and selects said retry delay time if said component under test fails.

17. A system in accordance with claim 16, wherein:

said retry delay time comprises a pre-determined maximum delay time.

18. A system in accordance with claim 16, wherein:

said adaptive delay learning process comprises an audit function which allows said initial delay value to be periodically reselected.

* * * * *